United States Patent [19]
Jeffries et al.

[11] Patent Number: 5,745,342
[45] Date of Patent: Apr. 28, 1998

[54] HINGE DETENT MECHANISM IN A COMPUTER SYSTEM

[75] Inventors: John Jeffries, Marble Falls; Gilberto Hernandez, Pflugerville, both of Tex.

[73] Assignee: Dell U.S.A., L.P., Austin, Tex.

[21] Appl. No.: 770,400

[22] Filed: Dec. 20, 1996

[51] Int. Cl.[6] .................................. G06F 1/16; H05K 7/16
[52] U.S. Cl. .................................. 361/683; 361/725
[58] Field of Search .................................. 361/680–683, 361/686, 724–727, 610; 364/708.1; 312/223.1, 223.2; 16/221–392; G06F 1/16

[56] References Cited

U.S. PATENT DOCUMENTS

| | | |
|---|---|---|
| 3,576,271 | 4/1971 | Seeley. |
| 3,916,479 | 11/1975 | Parker et al. |
| 4,458,379 | 7/1984 | Shelton. |
| 4,949,427 | 8/1990 | Keller. |
| 5,008,976 | 4/1991 | Busch. |
| 5,185,790 | 2/1993 | Mischneko. |
| 5,346,272 | 9/1994 | Priest et al. |
| 5,412,842 | 5/1995 | Riblett. |
| 5,619,397 | 4/1997 | Honda et al. ............... 361/686 |
| 5,633,782 | 5/1997 | Goodman et al. ............ 361/683 |

*Primary Examiner*—Lynn D. Feild
*Attorney, Agent, or Firm*—Haynes and Boone L.L.P.

[57] ABSTRACT

A multi-positionable power supply mounting hinge device includes first and second chassis members. The second chassis member is movably connected to the first chassis member. A bracket is fixedly mounted on the first chassis member. A flexible hinge detent member is connected to the second chassis member and extends to movably engage the bracket. The hinge detent member includes a wavy surface of sequentially variable protrusions and depressions. The wavy surface is in continuous friction engagement with the bracket in response to the hinge member being deflected when the second chassis member is moved relative to the first chassis member.

31 Claims, 3 Drawing Sheets

HINGE DETENT MECHANISM IN A COMPUTER SYSTEM

BACKGROUND

The disclosures herein relate generally to a hinge detent mechanism in a computer system and more particularly to a hinge for providing multiple detent positions so that a component of a computer system can be pivoted to various positions relative to its CPU chassis mounting for access to system electronics in the chassis.

In a desktop chassis the CPU is often accessed for maintenance. Preferably, components can be easily removed to provide access to electronics boards mounted in the chassis. One of the components, e.g. the power supply, is heavy and often must be removed to provide access to other components. The power supply may be hinge mounted in the chassis so as to quickly swing or pivot out of its stored position within the chassis to an access position out of the chassis.

In order to meet the accessibility requirements, it may be necessary to pivot the power supply upward against gravity. While in the pivoted-up position, it is also important to provide a feature to hold the power supply in the up position to limit the possibility that the power supply may drop back to its stored position while maintenance is being performed in the chassis.

Also, during manufacturing, the installed power supply may be required to be pivoted upward out of its stored position to provide access to install other components within the chassis. However, due to the position of fixed manufacturing equipment, it may not be either convenient or possible to pivot the power supply to the full pivoted-up position. In this case, the power supply would have to be at times pivoted-up for chassis access and at other times have to be stored to bypass fixed manufacturing equipment. However, it would be advantageous to be able to maintain the power supply in a partially pivoted-up position throughout manufacturing to provide the needed access and avoid interference with the manufacturing equipment.

Therefore, what is needed is an apparatus and a method for maintaining the power supply in multiple positions relative to the chassis to enable access to other chassis components for routine maintenance. It is also highly desirable to enable such access for installation of those components during manufacture.

SUMMARY

One embodiment, accordingly, provides an apparatus and a method for maintaining the power supply of a computer system in multiple positions relative to the chassis to enable access to other chassis components. To this end, first and second chassis members are provided. The second chassis member is movably connected to the first chassis member. A bracket is fixedly mounted on the first chassis member. A flexible hinge detent member is connected to the second chassis member to extend therefrom and movably engage the bracket. The hinge detent member includes a wavy surface of sequentially variable protrusions and depressions. The wavy surface is in continuous friction engagement with the bracket in response to the hinge member being deflected when the second chassis member is moved relative to the first chassis member.

One advantage of this embodiment is that the power supply is movable to be maintained in stored, intermediate and open positions relative to the main chassis. This provides quick access for maintenance of the power supply and other electronic components housed near the power supply in the main chassis and permits ease of installation of those other components during manufacture. This is in contrast to prior art mounting devices where the power supply is movable only to either an open or a stored position and while in the open position, may be free to swing to the stored position rather than being restrained in the open position.

DESCRIPTION OF THE PREFERRED EMBODIMENT

Figure 1:
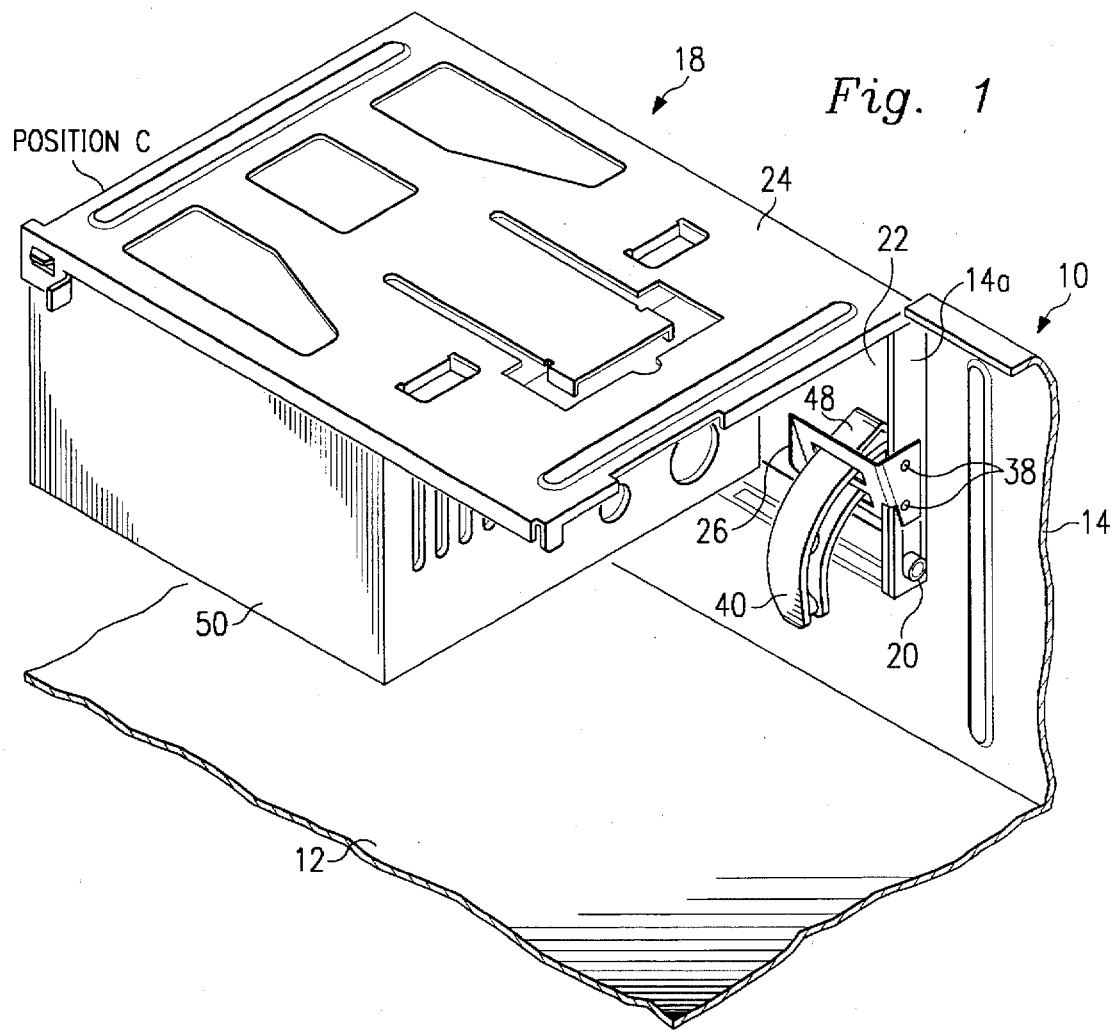
FIG. 1 is an isometric view illustrating an embodiment of a portion of a main chassis including a relatively movable chassis door having a power supply mounted thereon in a stored position and including a hinge detent device.
Figure 1A:
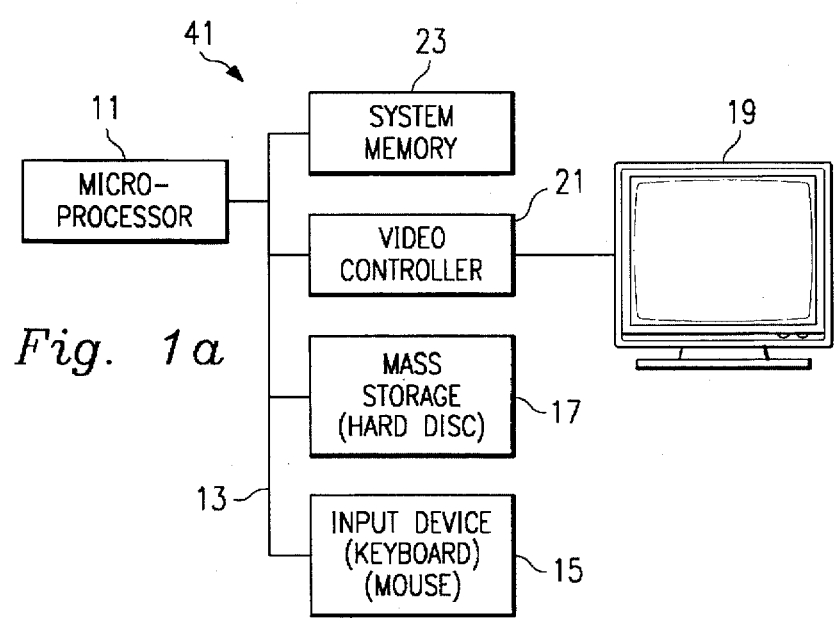
FIG. 1a is a diagrammatic view illustrating an embodiment of a typical computer system.
Figure 2:
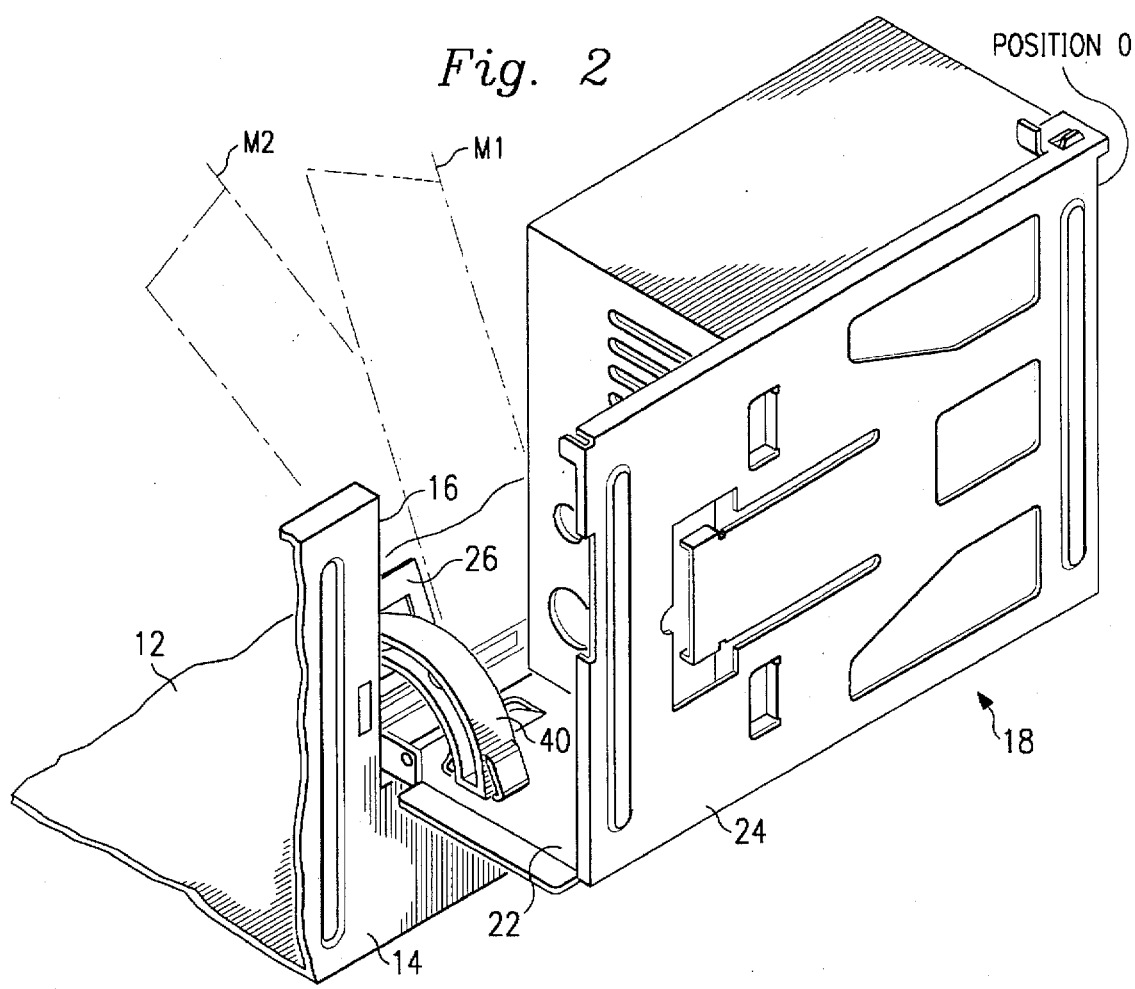
FIG. 2 is an isometric view illustrating an embodiment of the movable chassis door and power supply in a fully open position and including the hinge detent device.

Referring to FIG. 1, illustrated is an isometric view of a main portion of a CPU chassis 10, typically of a suitable material such as steel or plastic, as is commonly utilized in a computer system 41, FIG. 1a. Chassis 10 is provided with a bottom panel 12 and a side panel 14. A portion of side panel 14 is cut away to provide an opening 16, see FIG. 2. A chassis door 18 is provided to support a power supply 50. Door 18, mounted in opening 16, is generally L-shaped and is pivotally connected to side panel 14 at pivot pin 20, see FIG. 1. Door 18 includes a side panel 22 and a top panel 24.

In one embodiment, computer system 41, FIG. 1a, includes a microprocessor 11 which is connected to a bus 13. Bus 13 serves as a connection between microprocessor 11 and other components of computer system 41. An input device 15 is coupled to microprocessor 11 to provide input to microprocessor 11. Examples of input devices include keyboards, touchscreens, and pointing devices such as mouses, trackballs and trackpads. Programs and data are stored on a mass storage device 17 which is coupled to microprocessor 11. Mass storage devices include such devices as hard disks, optical disks, magnetic-optical drives, floppy drives and the like. Computer system 41 further includes a display 19 which is coupled to microprocessor 11 by a video controller 21. A system memory 23 is coupled to microprocessor 11 to provide the microprocessor with fast storage to facilitate execution of computer programs by microprocessor 11. It should be understood that other busses and intermediate circuits can be deployed between the components described above and microprocessor 11 to facilitate interconnection between the components and the microprocessor.

When door 18 is in a closed position designated "C" in FIG. 1, side panel 22 of door 18 is aligned with side panel 14 of main chassis 10, and top panel 24 of door 18 is parallel with and spaced apart from bottom panel 12 of main chassis 10. When door 18 is pivoted 90° to a fully open position designated "O" in FIG. 2, side panel 22 of door 18 is parallel to bottom panel 12 of main chassis 10 and top panel 24 of door 18 is in a direction transverse to bottom panel 12 of main chassis 10. Examples of intermediate positions designated M1 and M2 are partially shown in phantom outline in FIG. 2 for illustration purposes.

Figure 3:
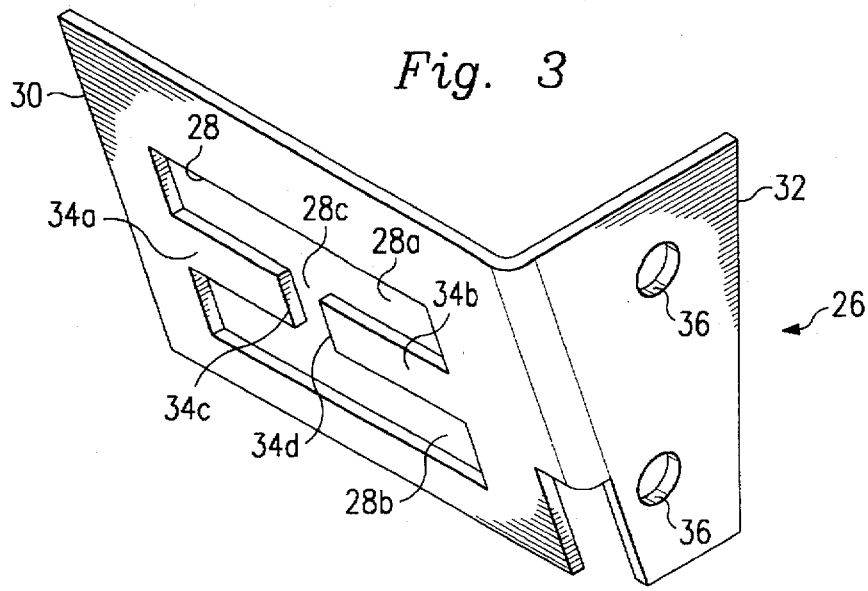
FIG. 3 is an isometric view illustrating an embodiment of a bracket portion of the hinge detent device.

A bracket 26, FIG. 3, is preferably formed of steel and includes a receiver portion 30 and also includes a mounting portion 32. An opening 28 is formed in receiver portion 30 and is generally of a shape to receive a member having an I-beam cross-section including flange openings 28a and 28b and an interconnecting rib opening 28c. Rib opening 28c is defined by two opposed extensions 34a and 34b which are spaced apart at terminal edge portions 34c and 34d, respectively. Mounting portion 32 includes mounting holes 36 formed therein for receiving fasteners 38 for mounting bracket 26 on a flange 14a connected to side panel 14 of main chassis 10, see FIG. 1.

Figure 4:
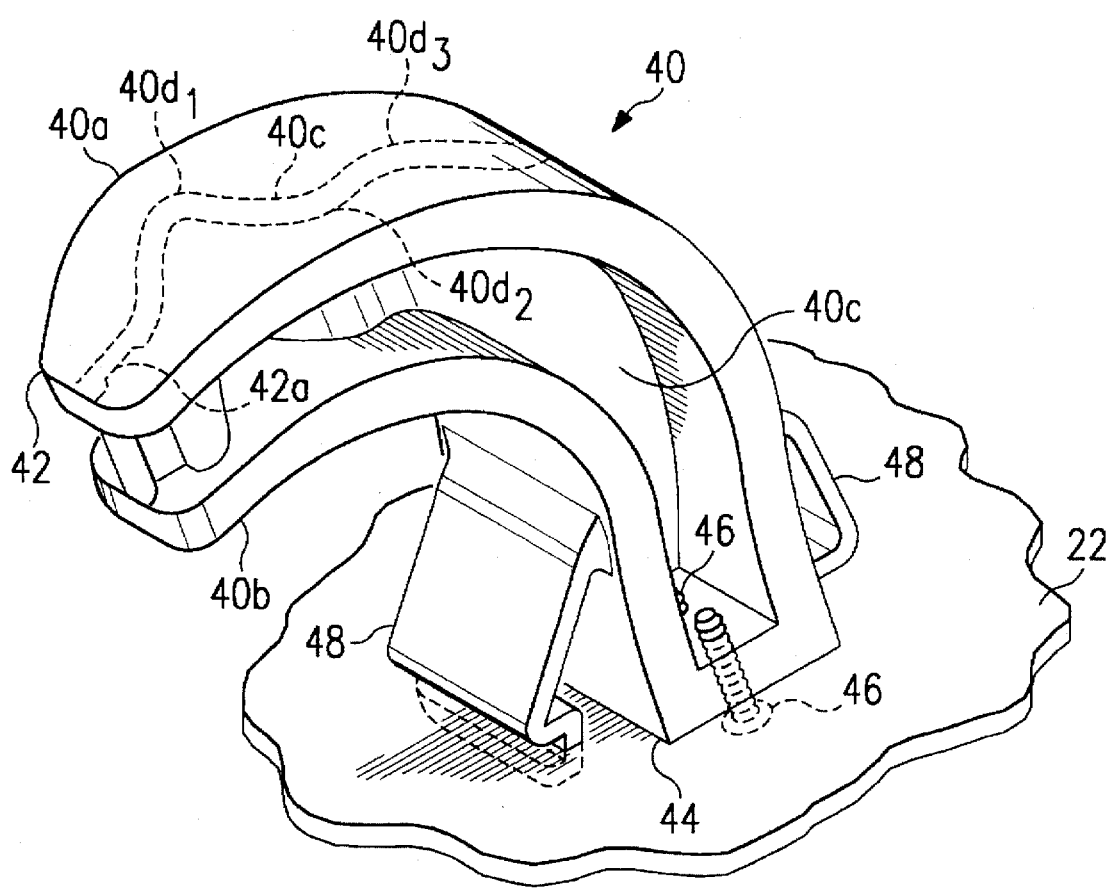
FIG. 4 is an isometric view illustrating an embodiment of a beam portion of the hinge detent device.

A cantilever hinge detent member 40, FIG. 4, includes a free end 42 and a support end 44. Member 40 is in the form of an I-beam curved along its longitudinal axis including flanges 40a and 40b interconnected by a rib 40c which has a constant thickness and a wave-like profile including a free end detent position 42a for engaging edge portions 34c and 34d when door 18 is in position "O" and a plurality of undulations, for example $40d_1$, $40d_2$, and $40d_3$. The undulations $40d_1$, $40d_2$ and $40d_3$ are sequentially variable between free end 42 and support end 44. That is, the undulations $40d_1$, $40d_2$, and $40d_3$ gradually diminish in size in a direction extending from free end 42 to support end 44. For example, undulation $40d_1$, is greatest in size, $40d_2$ is of a smaller size than $40d_1$ and $40d_3$ is of a smaller size than $40d_2$, etc. Curvature of member 40 permits arcuate travel through stationary bracket 26 as door 18 is pivoted. Support end 44 is preferably attached to panel 22 of door 18 by suitable fasteners such as screws 46 or the like. Support end 44 may also include a pair of optional angled flanges 48 which may provide additional stability if desired. Flanges 48 provide an outrigger effect by engaging panel 22 on opposite sides of support end 44. Also, free end 42 is tapered to ease the entry of member 40 into opening 28.

In operation, bracket 26 is attached to flange 14a of main chassis 10 adjacent opening 16 formed therein. Hinge detent member 40 is attached to panel 22 so that member 40 extends through bracket 26, FIGS. 1 and 2. More specifically, in FIGS. 3 and 4, it can be seen that bracket 26 is provided to receive member 40 such that flange openings 28a and 28b are provided to receive flanges 40a and 40b, respectively. Rib opening 28c is provided to receive rib 40c in such a manner that the wavy opposed surfaces of rib 40c are in continuous friction engagement with terminal edge portions 34c and 34d of opposed extensions 34a and 34b, respectively. Thus, it can be observed that as the curved, flexible hinge detent member 40 passes through opening 28 of fixed bracket 26, member 40 is urged to flex in a reciprocating manner due to free end detent 42a and the exemplary undulations $40d_1$, $40d_2$, and $4d_3$ being guided between stationary terminal edge portions 34c and 34d. Due to the constant high friction forces on both sides of rib 40c, door 18, including the attached power supply 50 can be maintained at open position "O" and at substantially any intermediate position between closed position "C" and open position "O" as viewed in FIGS. 1 and 2.

As it can be seen, the hinge detent mechanism provides multiple detent positions as the power supply 50 and supporting chassis door 18 are rotated about pivot pin 20. This device substantially improves access to devices mounted within main chassis 10.

Hinge detent member 40 is of a variable geometry such that as the I-beam shape moves through the similarly shaped opening 28 of bracket 26, member 40 is deflected. The force required to deflect member 40, when multiplied by the coefficient of friction between rib 40c and terminal edge portions 34c and 34d, results in detent positions because member 40 provides locations of varying deflection. As a result, power supply 50 supported by door 18 can be positioned to remain in either fully or partially open positions.

The variable deflection of member 40 can be provided to take into effect the length change of the member 40 as it affects the deflection force and also the influence of gravity. Thus, the worst case loading due to gravity is when power supply 50 on door 18 is rotated 90° to position "O." The deflection is first calculated from knowledge of the length of member 40, the coefficient of friction between member 40 and the contact with bracket 26, and external forces. Then knowing that the force due to gravity decreases sinusoidally as power supply 50 is rotated to position "C," the amplitude of the deflection is multiplied by the sin of the angle at each detent position. For example:

Power supply weight=4.8 lb.

Center of mass=3 in. from pivot axis

The beam is 1 in. from pivot axis $M^1=M^2$ 4.8×3=F×1

F=14.4 lb.

The coefficient of friction between the beam and the fixed bracket is 0.3

For static equilibrium, the normal force is: N=F/u=14.4/0.3=48 lb.

Since the worst case condition due to gravity is when the power supply is in position "O," and since sin 90=1.0, then, N=48sin 90=48 lb.

If the power supply is moved to an intermediate position, e.g. 45°, then since sin 45=0.707, then N=48 sin 45=48×0.707=33.9 lb.

Since the normal force decreases, the deflection of the beam should be decreased in addition to the decrease due to the effective shorter beam length.

It is understood that several variations may be made in the foregoing embodiment. For example, the hinge detent mechanism may be utilized in any type of equipment where quick access to a component part may be desired. With reference to computer systems, for example, it may be utilized with component parts such as floppy or hard disk drives, CD-ROM drives, plug-in circuit boards and cards, CPU planars, and battery supplies, rather than just a power supply. Other equipment that it may be used with include instrumentation, test equipment such as biomedical equipment where test samples in a vial are placed in the device via the hinge detent mechanism, and covers or lids such as a gas cap on an automobile. The hinge detent mechanism may be used for other purposes also such as providing for variable amounts of ventilation for air circulation in equipment.

Although an illustrative embodiment has been shown and described, a wide range of modification, change and substitution is contemplated in the foregoing disclosure and in some instances, some features of the embodiment may be employed without a corresponding use of other features. Accordingly it is appropriate that the appended claims be construed broadly and in a manner consistent with the scope of the embodiment described herein.

What is claimed is:

1. A computer system comprising:

a chassis having first and second members for mounting a power supply;

said second chassis member movably connected to said first chassis member;

a microprocessor mounted on said first chassis member;

a memory module operably connected to the microprocessor;

a bracket fixedly mounted on the first chassis member; and a flexible hinge detent member connected to the second chassis member and extending therefrom to movably engage the bracket, the hinge detent member having a wavy surface of sequentially variable protrusions and depressions, the wavy surface being in continuous friction engagement with the bracket in response to the hinge member being deflected when the second chassis member is moved relative to the first chassis member.

2. The system as defined in claim 1 wherein the second chassis member is pivotally connected to the first chassis member.

3. The system as defined in claim 2 wherein the bracket has an opening formed therethrough and the hinge detent member extends through the opening formed in the bracket.

4. The system as defined in claim 3 wherein the hinge detent member has an I-beam cross-sectional shape and the opening in the bracket is of an I-beam shape for receiving the hinge detent member in mating engagement.

5. The system as defined in claim 2 wherein the second chassis member is positionable in a closed position, an open position and multiple intermediate positions between said open and closed positions.

6. The system as defined in claim 5 wherein said friction engagement is sufficient to maintain said second chassis member in said open position and said intermediate positions.

7. The system as defined in claim 2 wherein said hinge detent member is a cantilever beam having a first free end and a second end fixedly connected to the second chassis member.

8. The system as defined in claim 7 wherein the bracket has an opening formed therethrough and the hinge detent member is axially curved to travel through the opening when the second chassis member is pivoted.

9. The system as defined in claim 1 wherein the hinge detent member is deflected in reciprocal directions as the wavy surface is guided relative to the bracket.

10. The system as defined in claim 7 wherein the wavy surface includes a plurality of sequentially variable undulations between the first end and the second end.

11. The system as defined in claim 10 wherein the undulations gradually diminish in size in a direction extending from the first end to the second end.

12. A computer system having a chassis for mounting a power supply therein, comprising:

a first chassis member;

a second chassis member pivotally connected to the first chassis member;

a bracket fixedly mounted on the first chassis member, the bracket having an opening formed therein; and a cantilever hinge detent member having a first free end and a second end fixedly connected to the second chassis member and positioned to move in an arcuate path through the bracket opening when the second chassis member is pivoted relative to the first chassis member, the hinge detent member having a wavy surface of sequentially variable protrusions and depressions, the wavy surface being in continuous frictional engagement with the bracket so that the hinge detent member is deflected in reciprocal directions, transverse to the arcuate path, as the detent member is moved through the bracket opening.

13. The apparatus for mounting a power supply as defined in claim 12 wherein the hinge detent member has an I-beam cross-sectional shape and the opening in the bracket is of an I-beam shape for receiving the hinge detent member in mating engagement.

14. The apparatus for mounting a power supply as defined in claim 12 wherein the second chassis member is positionable in a closed position, an open position and multiple intermediate positions between said open and closed positions.

15. The apparatus for mounting a power supply as defined in claim 12 wherein the hinge detent member is axially curved to travel through the opening when the second chassis member is pivoted.

16. A method of positioning a computer system power supply comprising the steps of:

mounting a bracket on a first chassis member, the bracket having an opening formed therein;

connecting a second chassis member for movement relative to the first chassis member;

mounting a flexible hinge detent member on the second chassis member to extend therefrom and movably engage the bracket; and providing a wavy surface on the hinge detent member, the wavy surface including sequentially variable protrusions and depressions, the wavy surface being in continuous friction engagement with the bracket in response to the hinge member being deflected when the second chassis member is moved relative to the first chassis member.

17. The method of positioning a power supply as defined in claim 16, wherein the steps of mounting the flexible hinge detent member comprises the step of forming the detent member to have a curvature and to include an I-beam cross-sectional shape.

18. The method of positioning a power supply as defined in claim 17, wherein the step of mounting the bracket comprises the step of providing the opening in the bracket with an I-beam shape for receiving the detent member in mating engagement.

19. The method of positioning a power supply as defined in claim 18, wherein the step of providing the opening with an I-beam shape comprises the step of providing spaced apart surfaces for simultaneously engaging opposed sides of a rib of the I-beam shaped detent member.

20. The method of positioning a power supply as defined in claim 19. wherein the step of providing the wavy surface comprises the step of flexing the detent member to move in reciprocal directions.

21. A computer system having a hinge detent mechanism, comprising:

a chassis for mounting a power supply;

said chassis having a first chassis member;

said chassis having a second chassis member movably connected to the first chassis member;

a bracket fixedly mounted on the first chassis member; and a flexible hinge detent member connected to the second chassis member and extending therefrom to movably engage the bracket, the hinge detent member having a wavy surface of sequentially variable protrusions and depressions, the wavy surface being in continuous friction engagement with the bracket in response to the hinge member being deflected when the second chassis member is moved relative to the first chassis member.

22. The mechanism as defined in claim 21 wherein the second chassis member is pivotally connected to the first chassis member.

23. The mechanism as defined in claim 22 wherein the bracket has an opening formed therethrough and the hinge detent member extends through the opening formed in the bracket.

24. The mechanism as defined in claim 23 wherein the hinge detent member has an I-beam cross-sectional shape and the opening in the bracket is of an I-beam shape for receiving the hinge detent member in mating engagement.

25. The mechanism as defined in claim 22 wherein the second chassis member is positionable in a closed position, an open position and multiple intermediate positions between said open and closed positions.

26. The mechanism as defined in claim 25 wherein said friction engagement is sufficient to maintain said second chassis member in said open position and said intermediate positions.

27. The mechanism as defined in claim 22 wherein said hinge detent member is a cantilever beam having a first free end and a second end fixedly connected to the second chassis member.

28. The mechanism as defined in claim 27 wherein the bracket has an opening formed therethrough and the hinge detent member is axially curved to travel through the opening when the second chassis member is pivoted.

29. The mechanism as defined in claim 21 wherein the hinge detent member is deflected in reciprocal directions as the wavy surface is guided relative to the bracket.

30. The mechanism as defined in claim 27 wherein the wavy surface includes a plurality of sequentially variable undulations between the first end and the second end.

31. The mechanism as defined in claim 30 wherein the undulations gradually diminish in size in a direction extending from the first end to the second end.

* * * * *

UNITED STATES PATENT AND TRADEMARK OFFICE
CERTIFICATE OF CORRECTION

PATENT NO. : 5,745,342
DATED : April 28, 1998
INVENTOR(s) : John Jeffries and Gilberto Hernandez It is certified that error appears in the above-identified patent and that said Letters Patent is hereby corrected as shown below:

Column 3, line 54, "$4d_3$" should read --$40_3d$--

Signed and Sealed this

Seventeenth Day of August, 1999

Attest:

Q. TODD DICKINSON

*Attesting Officer*     *Acting Commissioner of Patents and Trademarks*